United States Patent [19]
Yoshikawa et al.

[11] Patent Number: 5,187,566
[45] Date of Patent: Feb. 16, 1993

[54] SEMICONDUCTOR MEMORY AND METHOD OF MANUFACTURING THE SAME

[75] Inventors: Susumu Yoshikawa; Junpei Kumagai; Shizuo Sawada, all of Yokohama, Japan; Yasuo Matsumoto, Sunnyvale, Calif.

[73] Assignee: Kabushiki Kaisha Toshiba, Kawasaki, Japan

[21] Appl. No.: 646,496

[22] Filed: Jan. 28, 1991

Related U.S. Application Data

[63] Continuation of Ser. No. 314,841, Feb. 24, 1989, abandoned.

[30] Foreign Application Priority Data

Feb. 26, 1988 [JP] Japan .................................. 63-43479

[51] Int. Cl.[5] .................... H01L 29/68; H01L 29/78; H01L 29/92
[52] U.S. Cl. ...................................... 257/301; 257/385
[58] Field of Search ................ 357/23.6, 45, 54, 55, 357/59

[56] References Cited

U.S. PATENT DOCUMENTS

| | | | |
|---|---|---|---|
| 4,686,552 | 8/1987 | Teng et al. | 357/23.6 |
| 4,785,337 | 11/1988 | Kennedy | 357/23.6 |
| 4,786,954 | 11/1988 | Morie et al. | 357/23.6 |
| 4,801,988 | 1/1989 | Kenny | 357/23.6 |
| 4,888,820 | 12/1989 | Chen et al. | 357/23.6 |

FOREIGN PATENT DOCUMENTS

| | | | |
|---|---|---|---|
| 0236089 | 9/1987 | European Pat. Off. | 357/23.6 |
| 54-40580 | 3/1979 | Japan . | |
| 58-215055 | 12/1983 | Japan . | |
| 61-56445 | 3/1986 | Japan | 357/23.6 |
| 61-67955 | 4/1986 | Japan | 357/23.6 |
| 61-166157 | 7/1986 | Japan | 357/23.6 |

Primary Examiner—Jerome Jackson, Jr.
Assistant Examiner—D. Monin
Attorney, Agent, or Firm—Finnegan, Henderson, Farabow, Garrett and Dunner

[57] ABSTRACT

In a semiconductor memory of the invention, the source or drain of a transfer gate MOS transistor is electrically connected to a charge storage first conductive layer through a third conductive layer.

4 Claims, 3 Drawing Sheets

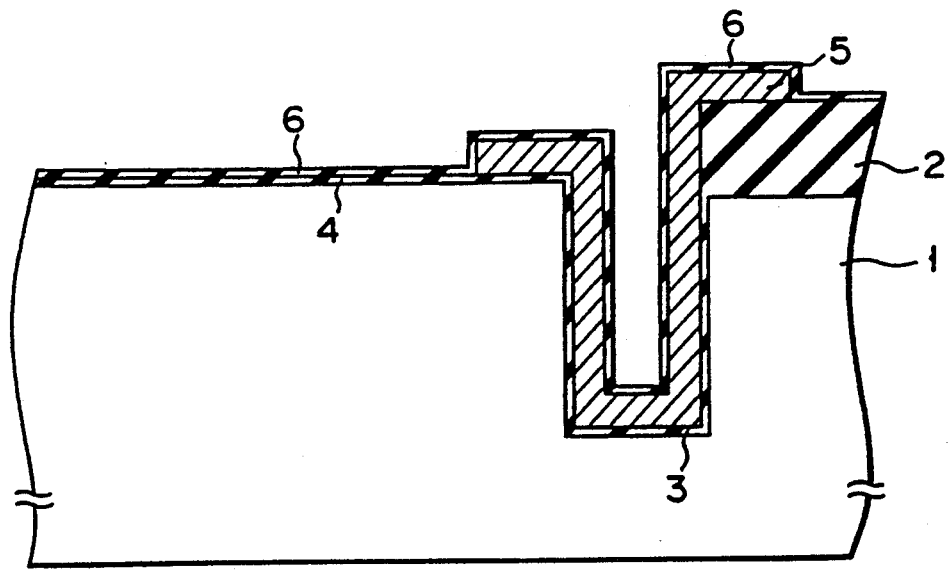
F I G. 2

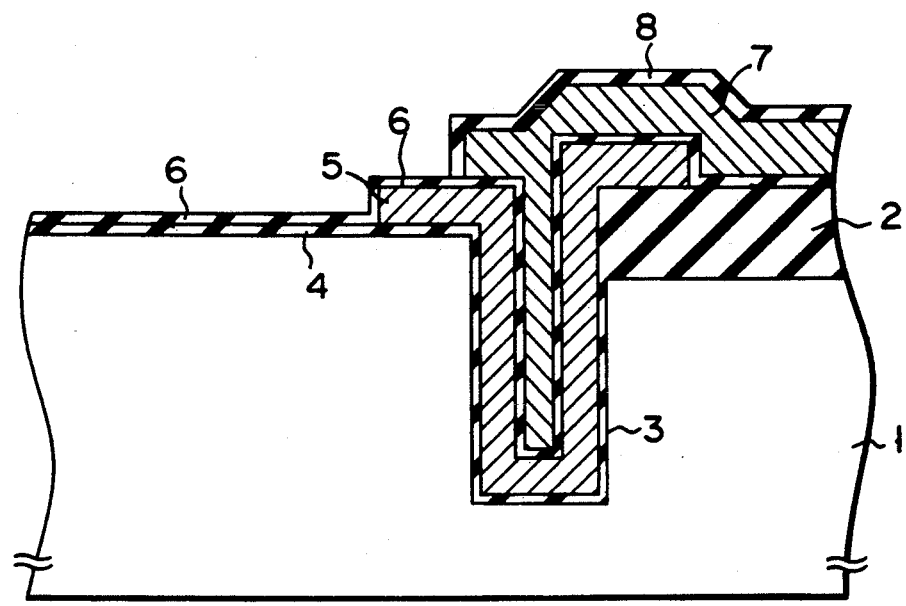
F I G. 3
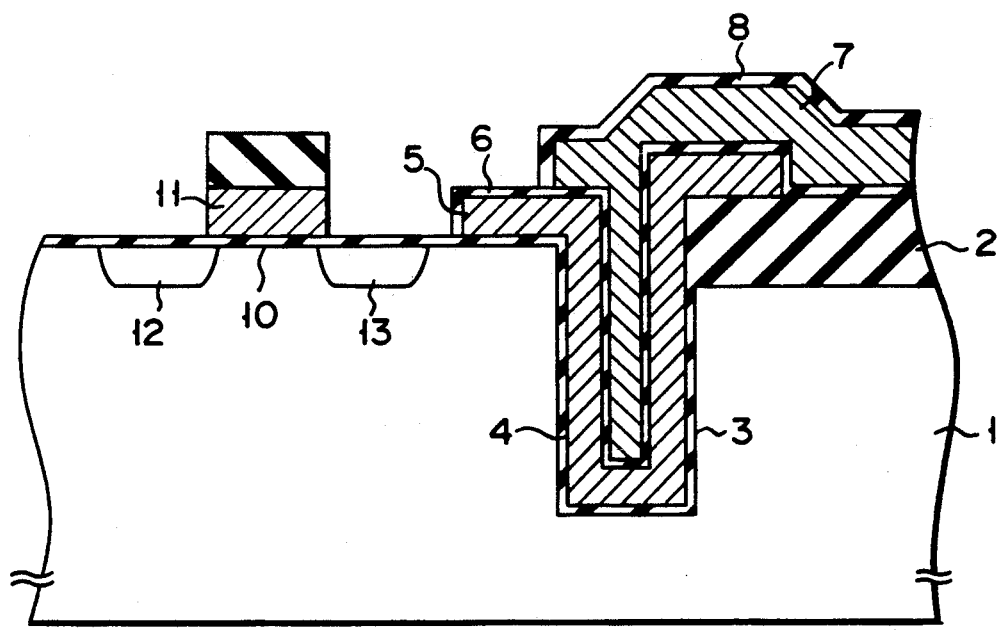
F I G. 4

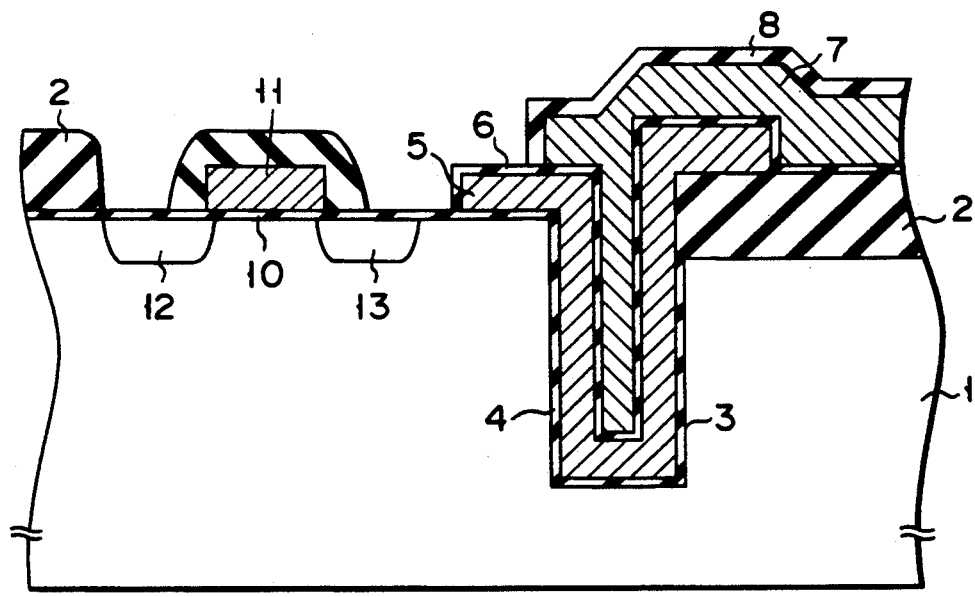
F I G. 5
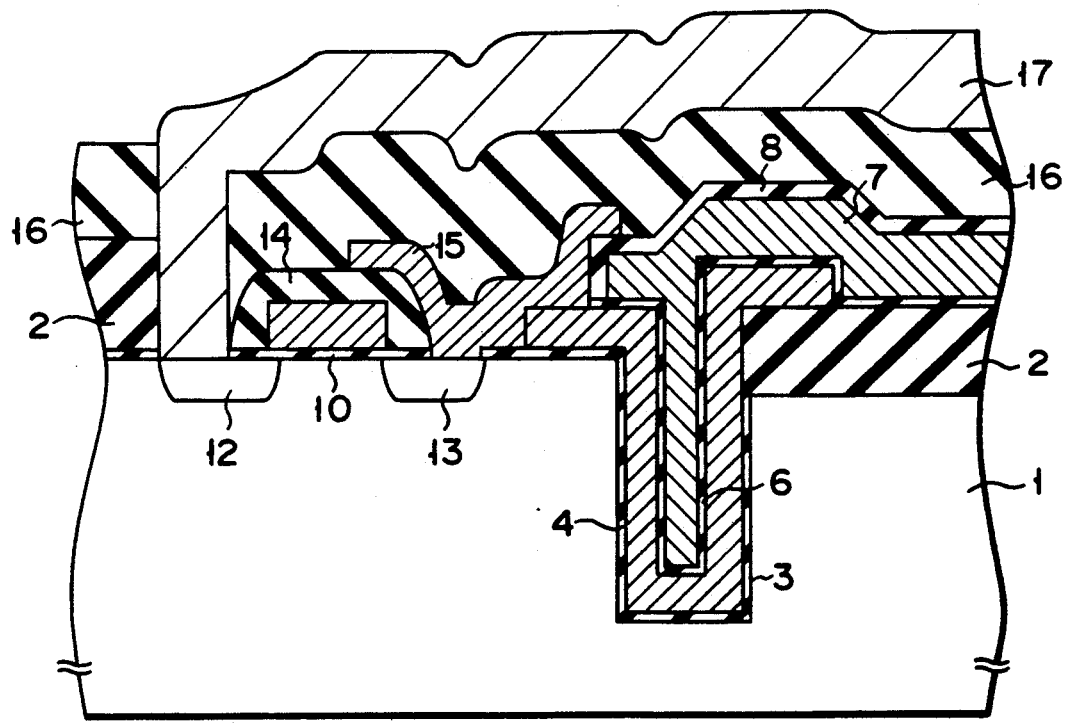
F I G. 6

SEMICONDUCTOR MEMORY AND METHOD OF MANUFACTURING THE SAME

This application is a continuation of application Ser. No. 07/314,841 filed Feb. 24, 1989 now abandoned.

BACKGROUND OF THE INVENTION

The present invention relates to a semiconductor memory and a method of manufacturing the same and, more particularly, to a semiconductor memory which can sufficiently achieve an electrical connection between a charge storage conductor for a capacitor and an impurity diffusion layer of a MOS transistor in a dynamic memory call consisting of a MOS transistor and a capacitor, and a method of manufacturing a semiconductor memory which does not require a mask alignment margin when a charge storage conductor is electrically connected to an impurity diffusion layer.

One MOS transistor for a transfer gate and one capacitor for charge storage have been conventionally used as a memory cell of a DRAM (a dynamic random access memory). A planar type capacitor, a stacked type capacitor, a trench type capacitor, or the like is used as the capacitor. In FIG. 1, one example called as buried stacked type capacitor is shown. Referring to FIG. 1, reference numeral 41 denotes a semiconductor substrate; 42, a field oxide film; 43, a trench formed in a part of an element formation region; 44, a first insulating film formed on the surface of the trench; 45, a capacitor charge storage layer formed on the first insulating film; 46, a capacitor insulating film formed on the charge storage layer 45; and 47, a capacitor electrode conductor formed on the capacitor insulating film 46. The conductor 47 is partially buried in the trench 43. Reference numeral 48 denotes a MOS transistor gate insulating film formed on a part of the element formation region of the substrate 41; 49, a gate electrode; and 50 and 51, impurity diffusion layers for source and drain regions formed in the surface of the substrate 41. In order to electrically connect the MOS transistor impurity diffusion layer 51 to the capacitor charge storage layer 45, a window 53 is formed in a part of the insulating film 44 on the surface of the substrate 41 by mask alignment etching. An impurity is diffused in the substrate 41 from the charge storage layer 45 through the window 53 to form a conductive layer 56. Thus, the impurity diffusion layer 51 is electrically connected to the charge storage layer 45 through the conductive layer 56. Note that reference numeral 54 denotes an interlayer insulating film; and 55, a bit line wiring layer.

As described above, however, when the insulating film 44 for preventing short-circuiting between the semiconductor substrate 41 and the charge storage layer 45 is partially opened to form the window 53 by mask alignment etching, a margin a must be formed to prevent misalignment between the window 53 and the charge storage layer 45. Furthermore, a margin b must be formed to prevent misalignment between the window 53 and the trench 43. For this reason, a memory cell area is undesirably increased by these margins a and b, and hence the integration degree of the memory cell cannot be increased. When the mask misalignment is large upon formation of the window 53, offset occurs between the conductive layer 56 formed by impurity diffusion through the window 53 and the impurity diffusion layer 51 of the transistor. As a result, the electrical connection between the two layers may not be sufficiently achieved.

On the other hand, in order to miniaturize a MOS transistor, an integrated circuit in which a source or drain region impurity diffusion layer on the substrate surface is connected to first and second polysilicon layers on the substrate through one contact opening via aluminum wiring is disclosed in Japanese Patent Disclosure (Kokai) No. 58-215055. A wiring contact structure in which an impurity diffusion layer on the substrate surface is connected to a first polysilicon semiconductor layer on the substrate through a second polysilicon semiconductor layer is disclosed in Japanese Patent Disclosure (Kokai) No. 54-40580.

The above disclosures do not disclose a manufacturing method for a miniaturizing a dynamic memory cell while the insulation between a capacitor charge storage layer and a capacitor electrode conductor is assured.

SUMMARY OF THE INVENTION

The present invention has been made in order to solve a problem that a memory cell cannot be sufficiently miniaturized because a mask alignment margin is required when a capacitor charge storage layer is electrically connected to a MOS transistor diffusion layer, and the electrical connection between the two layers cannot be sufficiently achieved when a mask misalignment is large. The present invention has as its object to provide a semiconductor memory which requires no mask alignment margin when the capacitor charge storage layer is electrically connected to the MOS transistor diffusion layer, and can sufficiently achieve the electrical connection between the capacitor charge storage layer and the MOS transistor diffusion layer, thereby improving the integration degree of the memory cell, and a method of manufacturing the semiconductor memory.

The semiconductor memory according to the present invention, comprises:

a semiconductor substrate of a first conductivity type;

a transfer gate MOS transistor formed on the semiconductor substrate;

a first conductive layer of a second conductivity type for charge storage of a memory cell capacitor, formed on the semiconductor substrate through a first insulating film;

an anti-oxidant capacitor insulating film formed on the first conductive layer while a part of the first conductive layer on the side of the MOS transistor is exposed;

a second conductive layer of the second conductivity type for a capacitor electrode, formed on the capacitor insulating film;

a first oxide film formed on the second conductive layer; and a third conductive layer of the second conductivity type for electrically connecting an impurity diffusion region of the second conductivity type of the MOS transistor to the first conductive layer.

In the semiconductor memory according to the present invention, an impurity diffusion layer serving as a source or drain of a transfer gate MOS transistor is connected to a charge storage first conductive layer through a third conductive layer.

When the third conductive layer is formed, therefore, the capacitor electrode second conductive layer is covered with the first oxide film, and hence the first conductive layer can be electrically connected to the impurity diffusion layer of the MOS transistor so that short-circuiting between the second conductive layer and the charge storage first conductive layer does not occur. At this time, since a mask alignment margin is not required, the memory cell size can be decreased, accordingly. Since an offset structure of the impurity diffusion layer and the third conductive layer does not occur, the electrical connection between the impurity diffusion layer and the first conductive layer can be sufficiently achieved.

A method of manufacturing a semiconductor memory according to the present invention, comprises the steps of:

forming a first insulating film on a semiconductor substrate of a first conductivity type;

forming a first conductive layer of a second conductivity type on the first insulating film and patterning the first conductive layer;

forming an anti-oxidant capacitor insulating film on an entire surface;

forming a second conductive layer of the second conductivity type on the entire surface to expose the second conductive layer by exposing the capacitor insulating film on and adjacent to MOS transistor formation region;

forming a first oxide film on the second conductive layer;

removing the first insulating film and the capacitor insulating film in the MOS transistor formation region;

forming a MOS transistor in the MOS transistor formation region in the semiconductor substrate;

removing a gate oxide film on an impurity diffusion region of the MOS transistor and the capacitor insulating film on the first conductive layer and forming a third conductive layer of the second conductivity type on the entire surface, patterning the third conductive layer, and electrically connecting the impurity diffusion region of the MOS transistor to the first conductive layer.

When the third conductive layer is formed, therefore, the capacitor electrode second conductive layer is covered with the first oxide film, and hence the first conductive layer can be electrically connected to the impurity diffusion layer of the MOS transistor so that short-circuiting between the second conductive layer and the charge storage first conductive layer does not occur. At this time, since a mask alignment margin is not required, the memory cell size can be decreased, accordingly. Since an offset structure of the impurity diffusion layer and the third conductive layer is not present, the electrical connection between the impurity diffusion layer and the first conductive layer can be sufficiently achieved.

BRIEF DESCRIPTION OF THE DRAWINGS

FIGS. 2 to 6 are sectional views showing a method of manufacturing a semiconductor memory according to the present invention.

DETAILED DESCRIPTION OF THE PREFERRED EMBODIMENT

Figure 1:
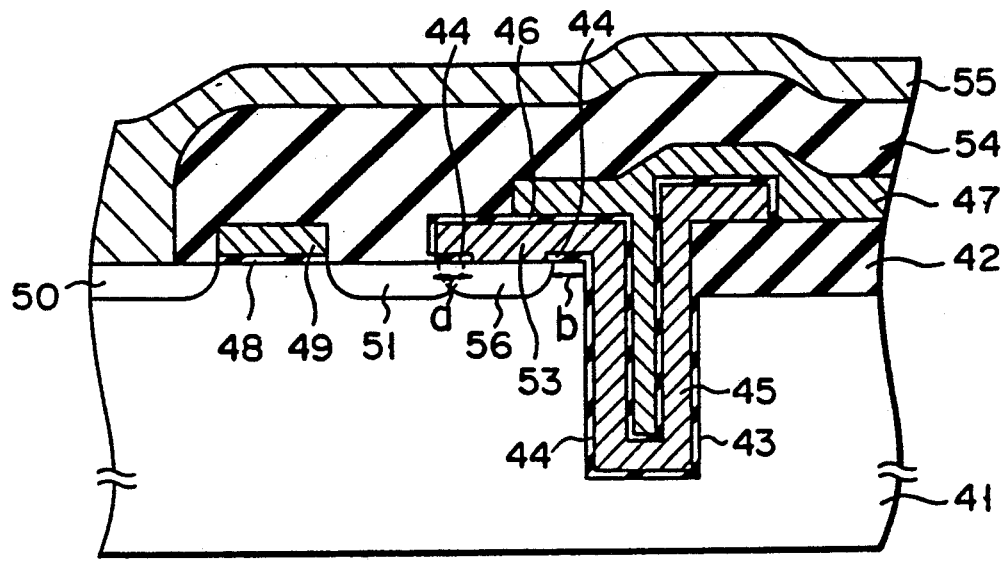
FIG. 1 is a sectional view of a conventional semiconductor memory.

The present invention will be described hereinafter with reference to the accompanying drawings.

In FIG. 2, reference numeral 1 denotes a p-type semiconductor substrate for a dynamic memory integrated circuit. As shown in FIG. 2, a field oxide film 2 having a thickness of about 4,000 Å is selectively formed on a part of the semiconductor substrate 1 to isolate an element region (e.g., a memory cell). Then, a part of the semiconductor substrate serving as the element region is etched together with a part of the field oxide film 2 in a chlorine-based gas atmosphere by anisotropic etching. Thus, a trench 3 having, e.g., an opening area of 0.7 $\mu m^2$ and a depth of 4 $\mu m$ is formed in the semiconductor substrate 1. An insulating film (an oxide film in this embodiment) 4 having a thickness of 500 to 1,000 Å is formed on the semiconductor substrate 1 and the inner surface (inner wall and bottom portion) of the trench 3 by steam oxidation at 900° C. A first polysilicon layer 5 having a thickness of about 1,000 Å in which phosphorus is doped as an impurity is formed on the oxide film 4 and the field oxide film 2 by CVD. After the first polysilicon layer 5 is patterned by lithography, as shown in FIG. 2, an anti-oxidant thin film (e.g., a silicon nitride film) having a thickness of about 50 to 70 Å is formed on the entire surface by CVD. An oxide film having a thickness of 20 to 40 Å is formed on the anti-oxidant film in an oxygen atmosphere at 800° C. As a result, a capacitor insulating film 6 consisting of two layers, i.e., the anti-oxidant film and the oxide film, is formed.

As shown in FIG. 3, a second polysilicon layer 7 having a thickness of about 1,000 Å in which phosphorus is doped is formed on the entire surface by CVD. Then, the second polysilicon layer 7 is patterned by lithography so that the capacitor insulating film 6 on the first polysilicon layer 5 and the transfer gate MOS transistor formation region is exposed.

An oxide film 8 having a thickness of about 1000 Å is formed on the second polysilicon layer 7 in an oxygen atmosphere at 850° C. At this time, the oxide film 8 is not formed on the anti-oxidant capacitor insulating film 6 on the first polysilicon layer 5.

As shown in FIG. 4, the oxide film 4 and the capacitor insulating film 6 on the MOS transistor formation region are removed. Thereafter, the entire surface is oxidized to form a MOS transistor gate insulating film 10. A polysilicon layer is formed on the entire surface by CVD, and a silicon nitride film or a silicon oxide film is formed on the polysilicon layer by CVD. A MOS transistor gate electrode 11 is formed by lithography and RIE. Source and drain 12 and 13 of the MOS transistor are formed by ion-implantation and thermal diffusion.

As shown in FIG. 5, a silicon nitride film or a silicon oxide film as an insulating film 14 is formed on the entire surface by CVD. The silicon nitride film or silicon oxide film is left on the side surface of the gate electrode 11 by etching back.

As shown in FIG. 6, the gate insulating film 10 on the drain 13 of the MOS transistor and the capacitor insulating film 6 exposed on the first polysilicon layer 5 are removed. A third polysilicon layer 15 having a thickness of 500 to 1,000 Å is formed on the entire surface by CVD, and is patterned by lithography.

Accelerated phosphorus ions are implanted in the third polysilicon layer 15, and a natural oxide film formed on the impurity diffusion layer 13 is broken, thereby electrically connecting the third polysilicon layer 15 to the impurity diffusion layer 13 of the MOS transistor. Then, the accelerated phosphorus ions are implanted again in the third polysilicon layer 15, and a natural oxide film formed on the first polysilicon layer 5 serving as a charge storage layer is broken, thereby electrically connecting the third polysilicon layer 15 to the charge storage layer 5. When the third polysilicon layer 15 is formed, since the capacitor electrode conductor 7 is covered with the oxide film 8, the capacitor electrode conductor 7 is not electrically connected to the charge storage layer 5 through the third polysilicon layer 15. Therefore, the capacitor does not short-circuit. Thereafter, a thick insulating film 16 is formed on the substrate, and a bit line wiring layer 17 is formed by the conventional processes.

According to the above-mentioned method of manufacturing the semiconductor memory of the present invention, the first polysilicon layer 5 serving as a capacitor charge storage layer can be electrically connected to the impurity diffusion layer 13 of the MOS transistor through the third polysilicon layer 15 so that short-circuiting with the capacitor electrode conductor 7 does not occur. At this time, since a mask alignment margin is not required, the memory cell size can be decreased, accordingly. In addition, since an offset structure of the impurity diffusion layer 13 and the third polysilicon layer 15 is not present, the electrical connection between the impurity diffusion layer 13 and the charge storage layer 5 can be sufficiently achieved.

Note that, in the above embodiment, a two-layered structure wherein an oxide film is formed on a silicon nitride film as the capacitor insulating film 6 is exemplified. However, on the contrary, a two-layered structure wherein a silicon nitride film is formed on an oxide film may be applied. In addition, a three-layered structure wherein a silicon nitride film is sandwiched between oxide films, or single layer structure of a silicon nitride film may be applied.

Arsenic may be doped in the polysilicon layers 5, 7, and 15 as an impurity. Ion-implantation for electrically connecting the third polysilicon layer 15 to the impurity diffusion layer 13 of the MOS transistor may be performed at the same time as ion-implantation for electrically connecting the third polysilicon layer 15 to the first polysilicon layer 5. Arsenic ions may be implanted upon the above-mentioned ion-implantation.

In the above embodiment, after the impurity diffusion layers 12 and 13 of the MOS transistor are formed, the contact with one of the diffusion layers 12 and 13 is achieved by ion-implantation in the third polysilicon layer 15. However, by ion-implantation for achieving the contact, impurity diffusion layers of the MOS transistor may be formed at the same time. The contact between the third polysilicon layer 15 and the impurity diffusion layer 13 of the MOS transistor may be achieved by impurity diffusion by a thermal treatment in place of the ion-implantation.

A silicide may be used in place of the above-mentioned third polysilicon layer 15.

In the above embodiment, the third polysilicon layer 15 is formed after the gate electrode 11 of the MOS transistor is covered with the insulating film 14. Therefore, the third polysilicon layer 15 can be aligned with the gate electrode 11 in self alignment.

In the above embodiment, a method of forming a memory cell using a trench type capacitor is exemplified. However, the present invention can be applied to the case wherein a planar type capacitor or a stacked type capacitor is used. In this case, the step for forming a trench in the semiconductor substrate in the above embodiment can be omitted.

What is claimed is:

1. A semiconductor memory comprising:
a semiconductor substrate of a first conductivity type;
a trench in said semiconductor substrate;
a first insulating film on said semiconductor substrate and on a side surface and a bottom surface of said trench;
a transfer gate MOS transistor having source and drain regions and a gate electrode;
a first conductive layer of a second conductivity type for charge storage of a memory cell capacitor in said trench, said first conductive layer having a peripheral portion which extends horizontally into said transfer gate MOS transistor and extends above said semiconductor substrate beyond said trench;
an anti-oxidant capacitor insulating film on said first conductive layer except on said peripheral portion of said first conductive layer, said anti-oxidant capacitor insulating film having a first thickness;
a second conductive layer of the second conductivity type for a capacitor elected on said capacitor insulating film;
an oxide film on said second conductive layer, said oxide film having a second thickness substantially greater than said first thickness and extending to the anti-oxidant capacitor insulating film at the peripheral portion of the first conductive layer;
a second insulating film surrounding said gate electrode of said transfer gate MOS transistor; and
a third conductive layer of the second conductivity type having an impurity species implanted therein for electrically connecting either said source or drain region of said transfer gate MOS transistor to said first conductive layer, one end of said third conductive layer extending onto said second insulating film and the other end of said third conductive layer extending onto said peripheral portion of said first conductive layer.

2. A memory according to claim 1, wherein said first, second, and third conductive layers comprise polysilicon layers, said first conductive layer having an impurity species diffused therein, said diffused impurity species being the same impurity as said implanted impurity species.

3. A memory according to claim 1, wherein said capacitor insulating film has a multi-layered structure consisting of a silicon nitride film on the first conductive layer and a silicon oxide film on the silicon nitride film.

4. A memory according to claim 1, wherein an insulating film of the same material as that of said first insulating film and said first conductive layer are present in said trench in said semiconductor substrate, said same material insulating film being on the surface of said trench.

* * * * *

UNITED STATES PATENT AND TRADEMARK OFFICE
CERTIFICATE OF CORRECTION

PATENT NO. : 5,187,566
DATED : February 16, 1993
INVENTOR(S) : Susumu Yoshikawa et al.

It is certified that error appears in the above-indentified patent and that said Letters Patent is hereby corrected as shown below:

Claim 1, column 6, line 27, change "elected"
to --electrode--.

Signed and Sealed this

Eleventh Day of January, 1994

Attest:

BRUCE LEHMAN

Attesting Officer

Commissioner of Patents and Trademarks